United States Patent [19]

Tanigawa

[11] 4,387,389
[45] Jun. 7, 1983

[54] SEMICONDUCTOR FILTER USING CHARGE TRANSFER DEVICE

[75] Inventor: Hiroshi Tanigawa, Tokyo, Japan

[73] Assignee: Nippon Electric Co., Ltd., Tokyo, Japan

[21] Appl. No.: 276,740

[22] Filed: Jun. 24, 1981

[30] Foreign Application Priority Data

Jun. 24, 1980 [JP] Japan ............................ 55-85373

[51] Int. Cl.³ .......................................... H04N 9/535
[52] U.S. Cl. .............................. 358/37; 307/221 D; 357/24; 358/40; 358/314; 360/38.1; 377/63
[58] Field of Search .................. 358/8, 21, 31, 40, 36, 358/37, 38, 160, 166, 96, 314; 357/24; 307/221 D; 333/141, 150; 360/38, 38.1

[56] References Cited

U.S. PATENT DOCUMENTS

| | | | |
|---|---|---|---|
| 4,122,489 | 10/1978 | Bolger et al. | 358/314 X |
| 4,158,209 | 7/1979 | Levine | 358/31 |
| 4,209,801 | 6/1980 | Dischert et al. | 358/37 |
| 4,217,605 | 8/1980 | Carnes et al. | 358/31 |
| 4,241,363 | 12/1980 | Maeyama et al. | 358/31 X |
| 4,245,199 | 1/1981 | Snoin | 357/24 |
| 4,259,596 | 3/1981 | Tiemann | 357/24 X |
| 4,270,144 | 5/1981 | Hartman et al. | 307/221 D |

Primary Examiner—Robert L. Richardson
Attorney, Agent, or Firm—Sughrue, Mion, Zinn, Macpeak and Seas

[57] ABSTRACT

A CCD comb filter is provided employing a basic block having a first, a second and a third delay line wherein particular mixing of the signals from the delay lines results in three outputs having a desired ratio. This basic block is utilized to construct a contour compensation circuit, a drop-out compensation circuit and a 3H delay line. The basic block is versatile and can be utilized for constructing other devices also.

14 Claims, 9 Drawing Figures

SEMICONDUCTOR FILTER USING CHARGE TRANSFER DEVICE

BACKGROUND OF THE INVENTION

This invention relates to a filter using a charge transfer device, and more specifically to a filter that can be effectively employed in a system for processing color television signals.

Along with the rapid progress of semiconductor integrated circuit techniques in recent years, charge transfer devices have been developed.

It is known that the charge transfer devices can be broadly divided into charge coupled devices (CCD) and bucket-brigade devices (BBD). The CCD is more advantageous for applications in the video frequency or to a signal having a 10 MHz sampling frequency.

On the other hand, developments in semiconductor technology have resulted in a higher degree of integration, a higher operation speed of digital memories and in reducing the cost of production. Digital signal processing techniques have become widespread in a number of electro-communication fields. Remarkable improvements have been made in digital processing techniques in video signal processing, and fully digitallized devices have been practically used in frame synchronizers, time base correctors, and the like. However, these techniques have an essential need for analog and digital conversion systems at their input/output portions and conversion systems are not yet economical at present. In other words, though digital signal processing techniques make it possible to secure accuracy by increasing the number of bits, it calls for large power consumption, becomes large in size and is likely to become very expensive.

This tendency becomes all the more pronounced as the frequency becomes higher, and it seems unlikely that the digital techniques could be applied to home-use appliances processing a video frequency signal. Since signal processing using the CCD does not have a large power consumption, is small in size, and inexpensive, it is well suited for electro-communication, especially for appliances in the video frequency. The signal processing in these appliances is accomplished by a comb filter. As to a signal processing circuit using a comb filter of the CCD, a chrominance-luminance separation circuit is disclosed in the specification of U.S. Pat. No. 4,096,516.

The comb filter used in the abovementioned chrominance-luminance separation circuit includes a first CCD delay line for delaying an input signal by at least one horizontal scanning period, a second CCD delay line for delaying an input signal to produce an output signal which is faster by one horizontal scanning period than the output signal of the first CCD delay line, a third CCD delay line for first inventing an input signal and then delaying the signal to produce an output signal which is faster by one horizontal scanning period than the output of the first CCD delay line, a first adder for adding the output of the first CCD delay line to that of the second CCD delay line to obtain a first output, and a second adder for adding the output of the second CCD delay line to that of the third CCD delay line to obtain a second output, whereby a luminance signal is obtained as the first output and a chrominance signal as the second output.

However, the known comb filter is suited for the separation of chrominance-luminance signals of so-called NTSC color television signals, but is not so well suited for other applications. Besides the chrominance-luminance separation circuit, there are a large number of applications of the comb filter processing a video frequency signal such as in a contour compensation circuit in a color camera, a foldover distortion elimination circuit in sub-Nyquist sampling, an adjacent-channel interference elimination circuit in a home-use VTR, and so forth, and the types of the comb filter include a 1H type, a 2H type, and so forth. In order to cover these numerous applications, it is more advantageous to form a basic block using a CCD, to connect a plurality of the resulting basic blocks and to modify the connection thereof to obtain an intended construction. This method makes it possible to furnish a low-cost mass-produced CCD of a limited type, but with such versatility that is would be applicable to a variety of appliances.

SUMMARY OF THE INVENTION

A primary object of the present invention is to provide a basic block of a CCD comb filter which has high versatility and can also be adapted to a 2H type filter.

It is another object of the present invention to provide a 2H type contour compensation circuit using the CCD comb filters.

In accordance with the present invention, there is provided a semiconductor device which comprises first, second and third delay lines constructed by charge transfer devices and integrated on the same substrate; driving means for driving the delay lines; input means for applying a signal to be processed to the input portions of the delay lines; and means for inverting the phase relation of the output of the third delay line with respect to the output each of the first and second delay lines; the first delay line including means in the output portion thereof for dividing a signal into a first divided signal, a second divided signal and a third divided signal in a predetermined division ratio, first mixing means for mixing the second division signal divided by the division means with a signal from the second delay line, second mixing means for mixing the third division signal divided by the division means with a signal from the third delay line, first and second output means for detecting the signals mixed by the first and second mixing means, respectively, and third output means for detecting the first divided signal divided by the division means.

In accordance with the present invention, there is also provided a contour compensation circuit which has the three abovementioned semiconductor devices, and which processes the three primary color signals (i.e., red, blue and green signals) as the signals to be processed, and in which the green signal is applied to input means of the first semiconductor device. A first output means of the first semiconductor device is coupled to the input means of the second semiconductor device and a second output means of the first semiconductor device is coupled to the input means of the third semiconductor device. It further comprises a differential circuit for differentiating the signal obtained at the first output means of the second semiconductor device, a lowpass filter for extracting low frequency components of the signal obtained at the second output means of the third semiconductor device, first addition means for adding the output signal of the differential circuit and the output signal of the lowpass filter to the red signal, second addition means for adding the signal obtained at the third output means of the first semiconductor device, the output signal of the differential circuit and the output signal of the lowpass filter together, third addition means for adding the output signal of the differential circuit and the output signal of the lowpass filter to the blue signal, and a processing circuit for obtaining color television signals from the output signals of the first, second and third addition means.

Thus, in accordance with the present invention, it is possible to obtain a comb filter which can be used either in a 1H type or in a 2H type and also to obtain a 2H type contour compensation circuit by use of the CCD comb filters.

BRIEF DESCRIPTION OF THE DRAWINGS

The above and further objects, features and advantages of the present invention will become more apparent from the following detailed description of embodiments taken in conjunction with the accompanying drawings.

DESCRIPTION OF THE PREFERRED EMBODIMENTS

Figure 1:
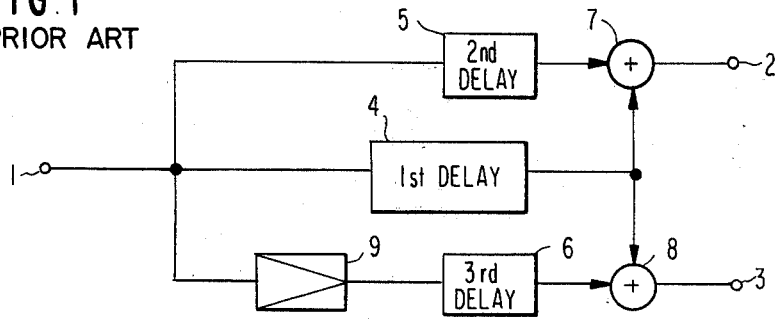
FIG. 1 is a block diagram showing a conventional CCD comb filter.

Referring now to FIG. 1, there is shown a conventional construction of a CCD comb filter which comprises an input terminal 1, output terminals 2 and 3, a first CCD delay line 4, second and third CCD delay lines 5 and 6, adders 7 and 8 and an inverting amplifier 9. The signal to be processed is applied to the input terminal 1 and led to the first and second delay lines 4 and 5, and after its phase is inverted by the inverting amplifier 9, to the third delay line 6. The output signals from the first, second and third delay lines 4, 5 and 6 are arithmetically added by the adders 7 and 8 in accordance with the connection shown in FIG. 1, thereby providing processed signals at the output terminals 2 and 3. In the video frequency, it is necessary to make the delay time difference between the delay lines 4 and 5 (or 6) equal to one horizontal scanning period (which is abbreviated to "1H" and is about 63.5 μsec in the NTSC system). Accordingly, the adding operation by the adders 7 and 8 becomes equivalent to an operation of determining the interrelation between two sampling points in the 1H interval, that is, the interrelation between two adjacent sampling points in the vertical direction on the picture. Due to the phase inverting operation by the inverting amplifier 9, the adding operation of the adder 8 determines the difference of signal quantities between these sampling points.

For the abovementioned reason, when the signal applied to the input terminal 1 is an NTSC system color television signal, a luminance signal and a chrominance signal are obtained at the output terminals 2 and 3, respectively, thereby achieving so-called "chroma-luma separation".

The CCD delay lines 5 and 6 have the same construction having one or two elements and are disposed to derive outputs having the same waveform as the output from the CCD delay line 4 because the signals to be added by the adders 7 and 8 are preferably waveforms of the same kind. Under such a construction, the number of elements of the first CCD delay line 4 must be set equal to the element number obtained by adding the element number of the second delay line 5 (or 6) to the element number corresponding to 1H period delay. For the adders 7 and 8, it is preferred to employ an electric charge adder in view of the input-output gain and the frequency characteristics of the phase. In FIG. 1, the phase inverting circuit of the inverting amplifier 9 is shown as if it were constructed of an electronic circuit, but it may also be constructed by an inverting input process inherent in the CCD by making use of a potential balancing input process for the voltage-to-charge converting portion of the CCD.

The abovementioned conventional example has no problem at all so long as the chrominance-luminance separation circuit is to be dealt with. However, the conventional CCD comb filter cannot be utilized to construct, for example, a 2H type contour compensator to be later described.

Figure 2:
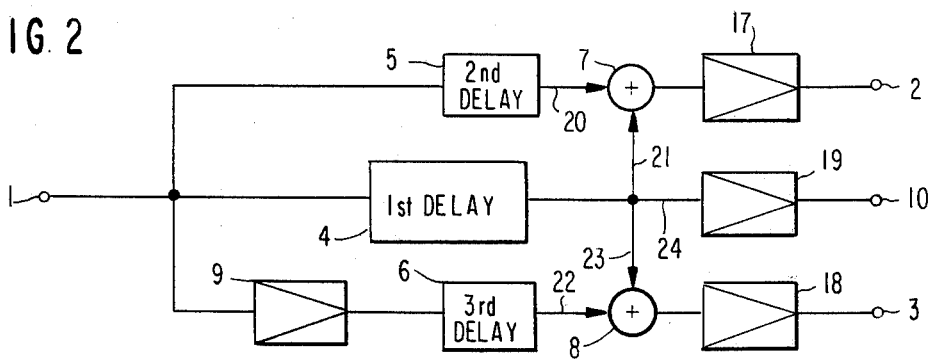
FIG. 2 is a block diagram showing a CCD comb filter in accordance with an embodiment of the present invention.

FIG. 2 shows an embodiment of the present invention and its basic block construction. In the drawing, the same reference numerals as in FIG. 1 signify the same constituents. In the embodiment shown, the outputs of the first CCD delay line 4 and the second CCD delay line 5 are applied to an adder 7 via signal lines 21 and 20, respectively. The output of the adder 7 is amplified by an output amplifier 17 and is then delivered to the output terminal 2. The output of the first delay line 4 is applied to an adder 8 via a signal line 23 and the output of the third CCD delay line 6, via a signal line 22, and the output of the adder 8 is amplified by the output amplifier 18 and is then led to the output terminal 3.

It is essential that the numbers of elements of the second and third delay lines 5 and 6 be equal to each other, and the element number (hereinafter represented by m) is preferably 1 to 2. It is not necessary that m be an integer. For example, it is possible to use m=1.5 if the driving phase number of the CCD is 2 (phases). For a more practical method of setting m, it may be arbitrarily selected to facilitate the CCD pattern design. In other words, the element number ("M") setting of the first delay line 4, is made so as to satisfy the relation $(M-m)/f_s = 1/f_H$ where $f_s$ is a sampling frequency of the CCD and $f_H$ is a horizontal scanning frequency. For example, the (M−m) value becomes 910 if $f_s$ is 14.4 MHz (four times the subcarrier frequency of the NTSC system).

Next, signal division in the output portion of the first CCD delay line 4 will be described. Since signals of the same energy must be delivered to the two input lines to the adder 7 (or 8), the signal levels of the signal lines 20, 21, 22, 23 must be the same as each other.

If the same three circuits are used for the three output amplifiers 17, 18, 19, the signal level in line 24 will be the signal level of the signal lines 21 and 23. In other words, in dividing the signal to the three signal lines 21, 23, 24 in the output portion of the first delay line 4, it is necessary to set the ratio of the signal levels of these signal lines 21, 23, 24 to 1:1:2. This can be achieved by a CCD charge transfer line by setting their widths to 1:1:2. For ease of pattern designing and for stabilization of characteristics, it is preferred that the channel width of the first delay line 4 be set to four times that of the second and third delay lines 5 and 6 and the ratio of the charge quantity transferring along these delay lines 4, 5, 6 is set to 4:1:1 with respect to a specific input signal level (applied to the input terminal 1).

Figure 3:
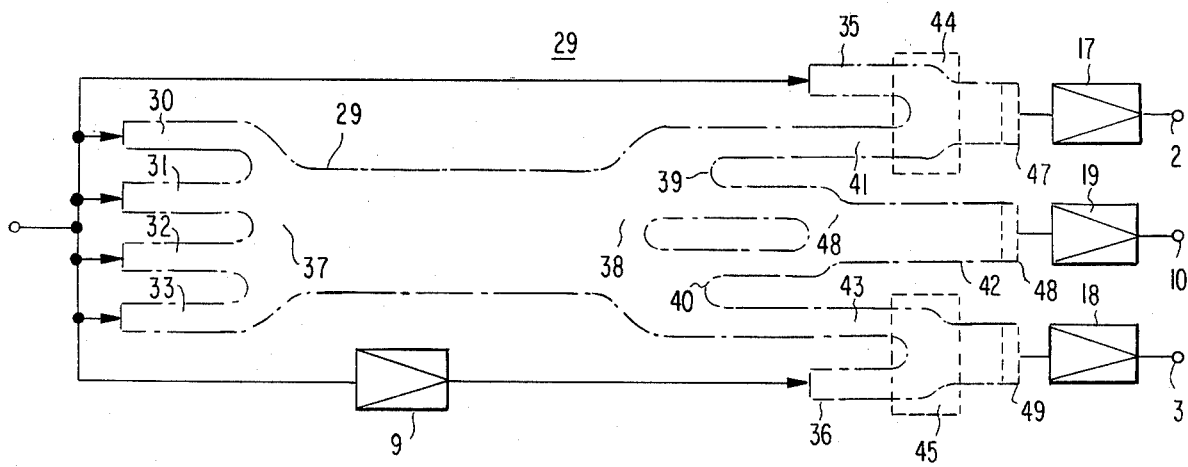
FIG. 3 is a block diagram useful for explaining the construction of the CCD in one embodiment of the present invention.

FIG. 3 diagrammatically shows the detailed construction of the CCD charge transfer line forming each delay line 4, 5, 6 on the basis of the abovementioned principle. All the element shown in FIG. 3 may be constructed on a single semiconductor substrate 29 by using well-known semiconductor integrated circuit techniques. In the drawing, first, second and third CCD delay lines 4, 5, and 6 and addition circuits 7, 8 of FIG. 2 are formed by the CCD charge transfer lines, and the boundary between the transfer lines and the channel stopper region is shown in more detail by chain-and-dot line 29. Needless to say, in practice, the CCD element includes an oxide film, a group of transfer electrodes, a diffusion layer for charge injection, transfer means and the like. In addition, the channel stopper region has a high impurity concentration having the same conductivity type as the semiconductor substrate 29. Here, a description of the method of arranging and forming these constituent elements on a single semiconductor substrate 29 has been omitted because it is well known to those skilled in the art.

In FIGS. 2 and 3, the same reference numerals have been used to identify the same constituents. In the drawing of FIG. 3, the channel width of the input portions 30 to 33 of the first delay line 4 is the same as that of the input portion 35 of the second delay line 5 and the input portion 36 of the third delay line 6. Accordingly, the same quantity of charge (but of the inverted phase only to 36) is injected to each of the input portions 30 to 33, 35 and 36. The quantity of charge injected at the input portions 30 to 33 collects at a junction portion 37. Downstream of the junction 37, the injected charge is transferred along a single transfer line consisting of a channel width four times that of the input portions 30 to 33 (more accurately, a channel width whose transfer charge quantity exceeds the sum of the injected charge quantities). Next, the transfer charge quantity is divided equally into four parts by channel dividing portions 38, 39, and 40, and two parts be are be mixed by a second mixing portion 48.

By the aforementioned division and mixing, the transfer charge quantity is divided in a ratio of 1:2:1 in three regions 41, 42 and 43. After being double weighted, the charge quantity is converted into a voltage via detection means 48, amplified by the output amplifier 19, and produced as an output from the terminal 10. This output signal at terminal 10 is a signal which is delayed by a delay time corresponding to the element number M with respect to the input signal.

On the other hand, the single weighted charge quantity passes through region 41, is charge-level added to a charge quantity applied to the input portion 35 of the second delay line at a mixing portion 44 and is thereafter converted into a voltage via detection means 47, amplified by the output amplifier 17, and produced as an output from terminal 2. Similarly, the other single weighted charge quantity passes through the region 43 and is added to a charge quantity applied to the input portion 36 of the third delay line (on which the charge quantity is phase-inverted) at the mixing portion 45. Thereafter, it is converted into a voltage via detection means 49, amplified by the output amplifier 18 and thereafter produced as an output from the terminal 3. In FIG. 3, it should be noted carefully that the adders 7 and 8 shown in FIG. 2 are realized at the charge level by mixing means 44, 45 for mixing the signals through the junction of the channels.

Although the mixing means of the signals is not hereby mentioned, various methods that are well-known to those skilled in the art may arbitrarily be selected. Examples of such methods include a method which mixes the signals under a single transfer electrode, a method which commonly leads the signals to a single floating diffusion layer for output detection, and others.

Figure 4:
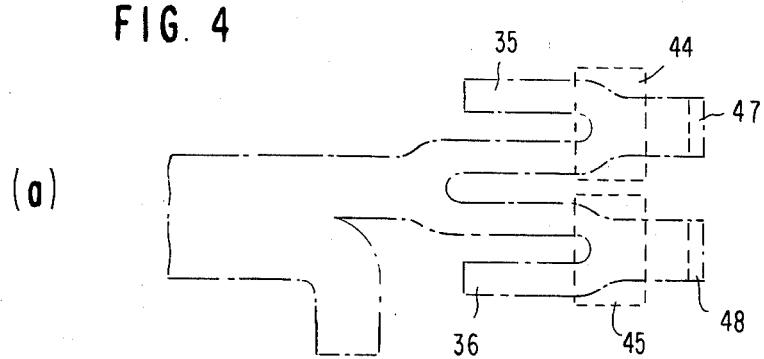
FIGS. 4(a) and 4(b) are block diagrams, each useful for explaining another construction of the CCD in accordance with the embodiment of the present invention and showing its output portion.

The example of the construction shown in FIG. 3 accomplishes the division in the ratio of 1:2:1 by use of the three dividing portions and one mixing portion, but it may be formed by other methods. For example FIG. 4 shows an alternative methods. FIG. 4(a) shows a method in which the channel is divided into 1:1 and one of them is further divided into 1:1, while FIG. 4(b) shows a method in which the channel is once divided into four parts of which two are mixed.

Various other methods may also be employed as the detection means 47, 48, 49, and it is obvious that a floating diffusion layer method equipped with a reset transistor can be used for detecting the charge in the channel. It is also obvious that a diode cut-off method, a floating diffusion layer method, a charge balancing method or the like may be used for constructing the input portion, though these methods are not shown in detail.

From aspect of the transfer efficiency, is advantageous to use a buried channel type method for forming the CCD transferring channel; however a surface channel type may also be employed. It is obvious that optional phases may be selected as the number of driving phases, such as a single phase, a 1.5-phase, a 2-phase and other polyphases.

Next, an example making use of the basic block of the abovementioned embodiment shown in FIG. 2 will be described.

Figure 5:
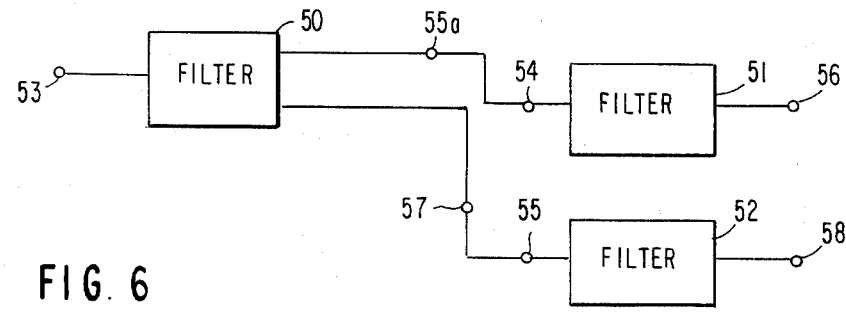
FIG. 5 is a block diagram showing an example of an application of the comb filter in accordance with the present invention.

FIG. 5 shows a block diagram of a comb filter using the embodiment of the preset invention and using three basic comb filters as shown in FIG. 2. This configuration can be constructed on a single chip or three different semiconductor chips by using well-known semiconductor integrated circuit techniques. In FIG. 5, reference numerals 50, 51, 52 represent respectively the individual filters using the basic configuration shown in FIG. 2. Reference numerals 53 to 55 represent input terminals corresponding to the input terminal 1 of FIG. 2. The reference numerals 55a, 56 represent output terminals corresponding to the output terminal 2 of FIG. 2, and the reference numerals 57, 58 represent output terminals corresponding to the out terminal 3 of the same figure. The signal obtained at the output terminal 55a is expressed by $$f(t)\cdot(1+Z^{-1})$$

where f(t) is a signal applied to the input terminal 53 and $Z^{-1}$ is an operator corresponding to the effective delay time difference inside block 50, 51, or 52. Since the abovementioned signal is processed as an input signal in block 51, the signal at the output terminal 56 becomes $f(t)\cdot(1+Z^{-1})^2$, that is, $f(t)\cdot(1+2Z^{-1}+Z^{-2})$. Here, if the signal f(to) is applied at the input terminal 53, and a signal which is delayed by 1H from f(t) and a signal which is delayed by 2H from f(t) are expressed by [0H], [1H] and [2H], respectively, the signal obtained at the output terminal 56 is expressed as follows:

$$([1H]+\tfrac{1}{2}\{[0H]+[2H)]\})$$

Similarly, the signal obtained at the output terminal 58 is expressed as:

$$([1H]-\tfrac{1}{2}\{[0H]+[2H]\})$$

In other words, the output of a 2H type comb filter can be obtained at the output terminals 56 and 58. If the configuration of FIG. 5 is applied to the signal processing circuit of the NTSC system color television, a luminance signal and a chrominance signal can be obtained separately from the output terminals 56 and 58, respectively.

Figure 6:
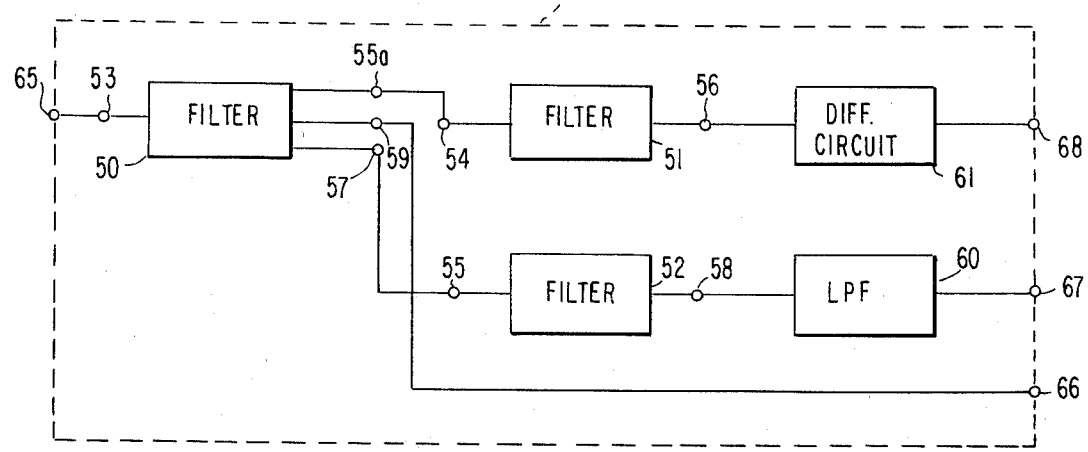
FIG. 6 is a block diagram showing the basic construction of a contour compensation circuit using the comb filter in accordance with the present invention.

FIG. 6 shows the basic block 62 applicable for forming a contour compensation circuit of 2H type which uses the comb filters of the present invention and is disposed inside a color TV camera. Here the output of the comb filter of FIG. 5 is further processed. In FIGS. 5 and 6, the same reference numerals are used to identify the same constituents. The signal obtained at the output terminal 58 is band-restricted to form a DC signal of about 2 MHz by a low-pass filter 60, thereby providing at the terminal 67 a contour signal (or so-called V. Detail) in the vertical direction. On the other hand, the signal obtained at the output terminal 56 is converted into a contour signal (or so-called H. Detail) in the horizontal direction by a differential circuit 61 of the time axis, and derived from the terminal 68. The differential circuit 61 is constructed by use of, for example, cable reflection.

The output terminal 59 corresponds to the terminal 10 of FIG. 2, and the aforementioned signal which is delayed by 1H (the [1H]signal) is obtained here. The delayed signal obtained at the output terminal 59 is derived from the terminal 66 as a so-called "Through" signal. Since the basic block 62 shown in FIG. 6 is used for a 2H type contour compensator, it is possible to regard the terminals 65, 66 and 67 and 68 as the input terminal, the "Through" signal output terminal, and V. Detail signal and H. Detail signal output terminals, respectively.

Figure 7:
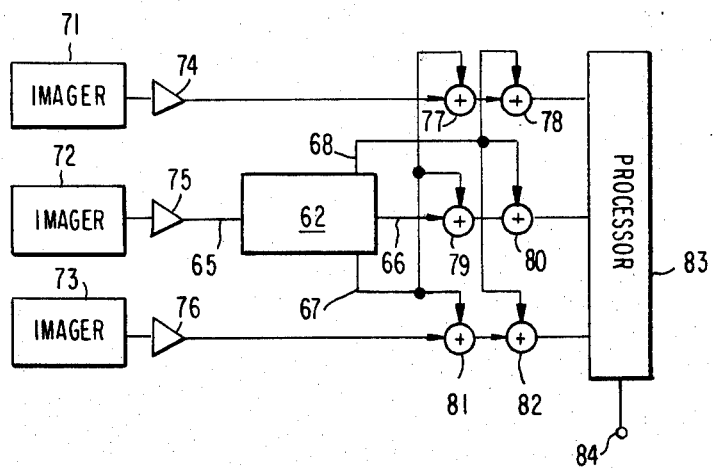
FIG. 7 is a block diagram showing the contour compensator using the comb filter in accordance with the present invention.

FIG. 7 shows an example in which the basic block 62 of FIG. 6 is adapted to the contour compensator for a color TV camera, and the same reference numerals are used in both figures to identify the same constituents. In the drawing in FIG. 7, reference numerals 71, 72 and 73 represent imaging elements for photoelectrically converting red, green and blue signals, respectively, and reference numerals 74, 75 and 76 represent amplifiers for amplifying the signals from these imaging elements 71, 72, 73 to desired levels, respectively. The green video signal is applied to the input 65 of the contour compensator 62 so that the V. Detail and H. Detail signals are obtained from the output terminals 67 and 68, respectively. These V. Detail and H. Detail signals and the "through" signal are given the desired weighting and are added by the adders 77 to 82, converted into desired signal systems by a processing circuit 83 including an encoder circuit or the like, and are produced as color TV signals from the output terminal 84.

Figure 8:
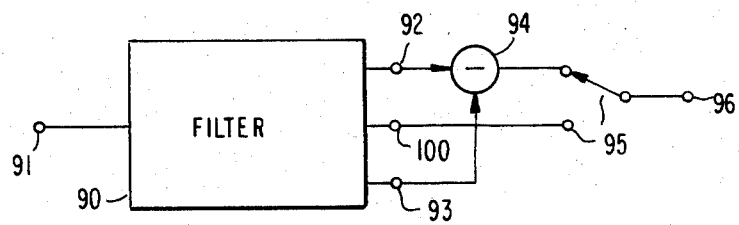
FIG. 8 is a block diagram showing a drop-out compensation circuit using the comb filter in accordance with the present invention.

FIG. 8 shows another embodiment using the comb filter of the present invention, as an example of an application to a drop-out compensation circuit. In the drawing, reference numeral 90 represents the basic block diagram shown in FIG. 2 and reference numerals 91, 92, 93 and 100 represent the terminals that correspond to the input terminal 1, the output terminals 2, 3 and the output terminal 10 of FIG. 2, respectively. Since the signals obtained at the terminals 92 and 93 correspond to ([0H]+[1H]) and (−[0H]+[1H]), respectively, a signal corresponding to [0H] can be obtained as the output of the subtractor 94.

The signal obtained at terminal 100 is [1H]. If a switch 95 is controlled in accordance with a control signal from a drop-out detection circuit (not shown), a normal signal after drop-out compensation can be obtained from terminal 96. Though not shown in FIG. 8, a level regulator (consisting of a combination of an amplifier and an attenuator) should be inserted between the terminal 100 and the switch 95 in order to control the signal level with the change-over operation of the switch 95 and to obtain the best reproduced picture.

Figure 9:
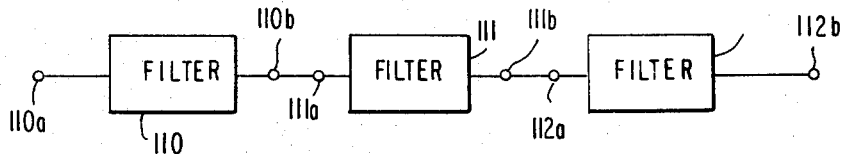
FIG. 9 is a block diagram showing a 3H delay line using the comb filter in accordance with the present invention.

FIG. 9 shows still another embodiment using the comb filter of the present invention, and illustrates an example which forms a 3H delay line using the three basic blocks 110, 111 and 112. In the drawing, three basic blocks 110, 111 and 112 are the comb filters shown in FIG. 2, and 110a, 111a and 112a represent the input terminals corresponding to the input terminal 1 of FIG. 2. Numerals 110b, 111b and 112b represent the output terminal 10 of FIG. 2. As is obvious from the construction of FIG. 9, it is possible, in accordance with the present invention, to form a delay line having a longer delay time by cascade-connecting a plural number of comb filters.

The 3H delay line shown in FIG. 9 can be effectively applied for constructing a time base corrector by using three of them arranged in parallel, changing over the input and output of each 3H delay line, sequentially, and controlling the transfer block frequency of each CCD. The comb filters of the present invention can also be applied to a television system converting circuit by making use of a construction analogous to the one shown in FIG. 9.

As is obvious from the foregoing detailed description, it is possible in accordance with the present invention to realize a comb filter having a wide range of versatility and that can be applied to a variety of video appliances.

What is claimed is:
1. A semiconductor filter comprising:
   first, second and third delay lines formed by charge transfer elements;
   means for applying a signal to be processed to the input portions of said first, second and third delay lines;

said third delay line having means for inverting the phase relation of the output of said third delay line with respect to the output of each of said first and second delay lines;

division means for dividing a signal provided at the output of said first delay line into a first divided signal, a second divided signal and a third divided signal in a predetermined division ratio;

first mixing means for mixing said second divided signal with an output signal from said second delay line;

second mixing means for mixing said third divided signal with an output signal from said third delay line;

first and second output means for providing as output signals the signals mixed by said first and second mixing means, respectively; and third output means for providing said first divided signal as an output.

2. The semiconductor filter as claimed in claim 1, wherein said division means divides the signal such that said first divided signal value is twice said second and third divided signals.

3. The semiconductor filter as claimed in claim 2, wherein each of said first, second and third delay lines, said division means and said first and second mixing means is formed by a charge coupling device.

4. A semiconductor filter as claimed in claim 3, further comprising first detection means for detecting the output of said first mixing means and for providing said first mixing means output signal to said first output means, second detection means for detecting the output of said second mixing means and for providing said second mixing means output to said second output means, and third detection means for detecting said first divided signal and for providing said first divided signal to said third output means.

5. The semiconductor filter as claimed in claim 1, said first, second and third delay lines being formed on the same substrate.

6. A semiconductor filter as claimed in claim 5, further comprising first detection means for detecting the output of said first mixing means and for providing said first mixing means output signal to said first output means, second detection means for detecting the output of said second mixing means and for providing said second mixing means output to said second output means, and third detection means for detecting said first divided signal and for providing said first divided signal to said third output means.

7. A semiconductor filter as claimed in claim 1, further comprising first detection means for detecting the output of said first mixing means and for providing said first mixing means output signal to said first output means, second detection means for detecting the output of said second mixing means and for providing said second mixing means output to said second output means, and third detection means for detecting said first divided signal and for providing said first divided signal to said third output means.

8. A semiconductor filter as claimed in claim 2, further comprising first detection means for detecting the output of said first mixing means and for providing said first mixing means output signal to said first output means, second detection means for detecting the output of said second mixing means and for providing said second mixing means output to said second output means, and third detection means for detecting said first divided signal and for providing said first divided signal to said third output means.

9. A color television contour compensation circuit comprising:

first, second and third semiconductor comb filters, each comprising first, second and third delay lines, means for delaying the output of said first delay line by a predetermined time period with respect to the output of each of said second and third delay lines, means for inverting the phase of the output of said third delay line with respect to those of said first and second delay lines; division means for dividing the output from said first delay line into first, second and third parts in a ratio of 2:1:1, first addition means for adding said second part of the output from said first delay line to the output of said second delay line, a first output terminal for taking out the output of said first addition means; second addition means for adding said third part of the output from said first delay line to the output of said third delay line, a second output terminal for taking out the output of said second addition means, and a third output terminal for taking out said first part of the output from said first delay line;

red signal-, blue signal- and green signal-input terminals for receiving red, blue and green signals;

means for coupling said green signal input terminal to the input terminal of said first semiconductor comb filter;

means for coupling a first output terminal of said first semiconductor comb filter to the input terminal of said second semiconductor comb filter;

differential circuit means coupled to an output terminal of said second semiconductor comb filter;

means for coupling a second output terminal of said first semiconductor comb filter to the input terminal of said third semiconductor comb filter;

lowpass filter means coupled to the output terminal of said third semiconductor comb filter;

first addition means for adding together the red signal applied to said red signal input terminal, the output of said differential circuit and the output of said lowpass filter;

second addition means for adding together the blue signal applied to said blue signal input terminal, the output of said differential circuit and the output of said lowpass filter;

third addition means for adding together the output obtained at the third output terminal of said first semiconductor comb filter, the output of said differential circuit and the output of said lowpass filter; and a processing circuit for obtaining color television signals from the outputs of each of said first, second and third addition means.

10. The color television contour compensation circuit as claimed in claim 9, wherein said predetermined time period of said means for delaying the output of said first delay line corresponds to one horizontal scanning period of a color television.

11. The color television contour compensation circuit as claimed in claim 10, said differential circuit being constructed by use of cable reflection.

12. The color television contour compensation circuit as claimed in claim 9, wherein said first, second and third delay lines, said division means and said first and second addition means contained in said first, second and third semiconductor comb filters are formed by charge coupling device.

13. A drop-out signal compensation circuit comprising first, second and third delay line, means for applying a signal to be processed to the input portions of said first, second and third delay lines; means for delaying the output of said first delay line by a predetermined time period with respect to the output of each of said second and third delay lines, means for inverting the phase of the output of said third delay line with respect to those of said first and second delay lines; division means for dividing the output from said first delay line into first, second and third parts in a ratio of 2:1:1, first addition means for adding said second part of the output from said first delay line to the output of said second delay line, a first output terminal for taking out the output of said first addition means; second addition means for adding said third part of the output from said first delay line to the output of said third delay line, a second output terminal for taking out the output of said second addition means, and a third output terminal for taking out said first part of the output from said first delay line;

subtractor means for subtracting the output at said first output terminal from the output at said second output terminal, and providing an output at a fourth output terminal;

said third output terminal being connected to a fifth output terminal;

switch means for switching between said fourth output terminal and said fifth output terminal;

said switch means being controlled to provide drop-out signals and provide normal signal after drop-out at a sixth output terminal.

14. The device of claim 13, further including signal level regulator means connected between said third and said fifth terminal.

* * * * *

UNITED STATES PATENT AND TRADEMARK OFFICE
CERTIFICATE OF CORRECTION

PATENT NO. : 4,387,389
DATED : June 7, 1983
INVENTOR(S) : Tanigawa

It is certified that error appears in the above-identified patent and that said Letters Patent is hereby corrected as shown below:

Column 1, line 56 - delete "inventing" insert --inverting--;

Column 5, line 61 - delete "be are be" insert --thereof are--;

Column 7, line 14 - delete "f(to)" insert --f(t)--.

Signed and Sealed this

Sixteenth Day of October 1984

[SEAL]

Attest:

GERALD J. MOSSINGHOFF

Attesting Officer

Commissioner of Patents and Trademarks